(12) United States Patent
Choi et al.

(10) Patent No.: US 10,466,748 B2
(45) Date of Patent: Nov. 5, 2019

(54) ROLLABLE DISPLAY DEVICE

(71) Applicant: SAMSUNG DISPLAY CO., LTD., Yongin-si (KR)

(72) Inventors: Jin Hwan Choi, Yongin-si (KR); Jeong Ho Kim, Yongin-si (KR); Hyun Woo Koo, Yongin-si (KR); Tae Woong Kim, Yongin-si (KR)

(73) Assignee: SAMSUNG DISPLAY CO., LTD., Yongin-si, Gyeonggi-Do (KR)

(*) Notice: Subject to any disclaimer, the term of this patent is extended or adjusted under 35 U.S.C. 154(b) by 0 days.

(21) Appl. No.: 16/143,936

(22) Filed: Sep. 27, 2018

(65) Prior Publication Data
US 2019/0212780 A1   Jul. 11, 2019

(30) Foreign Application Priority Data

Jan. 5, 2018   (KR) .................. 10-2018-0001738

(51) Int. Cl.
*H05K 1/00*      (2006.01)
*G06F 1/16*      (2006.01)
*G09G 3/3266*    (2016.01)
*H01L 27/32*     (2006.01)

(52) U.S. Cl.
CPC ......... *G06F 1/1652* (2013.01); *G09G 3/3266* (2013.01); *H01L 27/3246* (2013.01)

(58) Field of Classification Search
CPC .... G06F 1/1641; G06F 1/1652; G06F 1/1626; G06F 1/1679; G06F 11/30; G06F 1/1601; G09F 9/301; G02F 1/133305; H01L 51/0097; H05K 1/028

See application file for complete search history.

(56) References Cited

U.S. PATENT DOCUMENTS

| | | | |
|---|---|---|---|
| 5,954,560 A * | 9/1999 | Lepselter | H01J 9/241 445/24 |
| 8,451,417 B2 | 5/2013 | Won et al. | |
| 9,560,751 B2 * | 1/2017 | Huitema | H05K 1/028 |
| 9,761,632 B2 | 9/2017 | Li et al. | |
| 9,836,087 B2 * | 12/2017 | Kim | G06F 1/1652 |
| 9,870,029 B2 | 1/2018 | Kim et al. | |
| 9,899,458 B2 | 2/2018 | Park | |
| 10,095,273 B2 * | 10/2018 | Choi | G06F 1/1652 |
| 10,274,995 B2 * | 4/2019 | Seo | G06F 1/1643 |
| 10,318,129 B2 * | 6/2019 | Inagaki | G06F 1/1626 |

(Continued)

FOREIGN PATENT DOCUMENTS

| | | |
|---|---|---|
| KR | 10-2011-0133836 | 12/2011 |
| KR | 10-2015-0044290 | 4/2015 |

(Continued)

*Primary Examiner* — Yuriy Semenenko
(74) *Attorney, Agent, or Firm* — F. Chau & Associates, LLC

(57) ABSTRACT

A rollable display device includes a roller defining a rolling direction, and a rollable display unit. A first side of the rollable display unit is fixed to the roller, and the rollable display unit includes a plurality of spacers spaced apart from one another and arranged in the rolling direction. Heights of the spacers disposed near a second side of the rollable display unit opposing the first side are greater than heights of the spacers disposed near the first side of the rollable display unit.

20 Claims, 11 Drawing Sheets

(56) References Cited

U.S. PATENT DOCUMENTS

| | | | | |
|---|---|---|---|---|
| 2010/0171416 A1* | 7/2010 | Lee | ................. | H01L 51/525 |
| | | | | 313/504 |
| 2011/0043479 A1* | 2/2011 | van Aerle | ............. | G06F 1/1601 |
| | | | | 345/174 |
| 2014/0078154 A1* | 3/2014 | Payne | .................... | G02B 26/02 |
| | | | | 345/501 |
| 2015/0102320 A1 | 4/2015 | Jung | | |
| 2016/0300894 A1* | 10/2016 | Park | ................... | H01L 27/3246 |

FOREIGN PATENT DOCUMENTS

| | | |
|---|---|---|
| KR | 10-2015-0056809 | 5/2015 |
| KR | 10-1570869 | 11/2015 |
| KR | 10-2016-0120869 | 10/2016 |

* cited by examiner

ROLLABLE DISPLAY DEVICE

CROSS-REFERENCE TO RELATED APPLICATIONS

This application claims priority under 35 U.S.C. § 119 to Korean Patent Application No. 10-2018-0001738 filed on Jan. 5, 2018, the disclosure of which is incorporated by reference herein in its entirety.

TECHNICAL FIELD

Exemplary embodiments of the present disclosure relate to a rollable display device.

DISCUSSION OF RELATED ART

Display devices such as liquid crystal display devices, organic light emitting display devices, and plasma display devices, are commonly used today in electronic devices. In addition to conventional rigid flat display devices that use a glass substrate, display devices may also be flexible display devices that can be bent or rolled using a flexible plastic substrate. However, since rollable display devices do not use a rigid glass substrate, rollable display devices are vulnerable to an external impact.

The thickness of upper or lower films may be increased to improve the impact resistance of rollable display devices. However, as the thickness of the films increases, rolling stiffness also increases, which may cause defects such as layer separation or buckling when the rollable display device is rolled.

SUMMARY

Exemplary embodiments of the present disclosure provide a rollable display device including spacers which are different in height corresponding to a rolling direction in which impact resistance is selectively improved while also preventing an excessive increase in rolling stiffness.

According to an exemplary embodiment of the present disclosure, a rollable display device includes a roller defining a rolling direction and a rollable display unit. A first side of the rollable display unit is fixed to the roller, and the rollable display unit includes a plurality of spacers spaced apart from one another and arranged in the rolling direction. Heights of the spacers disposed near a second side of the rollable display unit opposing the first side are greater than heights of the spacers disposed near the first side of the rollable display unit.

In an exemplary embodiment, the heights of the plurality of spacers gradually decrease as the plurality of spacers is disposed closer to the first side of the rollable display unit.

In an exemplary embodiment, the rollable display unit includes a plurality of areas defined according to a radius of the roller and a thickness of the rollable display unit, and the heights of the plurality of spacers are different depending on the plurality of areas.

In an exemplary embodiment, the plurality of areas includes a first area disposed adjacent to the roller, and a second area disposed adjacent to the first area. The plurality of spacers includes a plurality of first spacers disposed in the first area and a plurality of second spacers disposed in the second area, and heights of the plurality of first spacers are less than heights of the plurality of second spacers.

In an exemplary embodiment, the plurality of areas further includes a third area disposed adjacent to the second area, the second area is disposed between the first area and the third area, the plurality of spacers further includes a plurality of third spacers disposed in the third area, and heights of the plurality of third spacers are greater than the heights of the plurality of first spacers and the heights of the plurality of second spacers.

In an exemplary embodiment, the plurality of spacers is a plurality of line spacers, and each of the plurality of line spacers extends in a direction substantially perpendicular to the rolling direction.

In an exemplary embodiment, heights of the plurality of line spacers gradually decrease as the plurality of line spacers is disposed closer to the first side of the rollable display unit.

In an exemplary embodiment, the rollable display unit includes a plurality of areas defined according to a radius of the roller and a thickness of the rollable display unit, and heights of the plurality of line spacers are different depending on the plurality of areas.

In an exemplary embodiment, the plurality of areas includes a first area disposed adjacent to the roller, and a second area disposed adjacent to the first area. The plurality of line spacers includes a plurality of first line spacers disposed in the first area and a plurality of second line spacers disposed in the second area, and heights of the plurality of first line spacers are less than heights of the plurality of second line spacers.

In an exemplary embodiment, the plurality of areas further includes a third area disposed adjacent to the second area, the second area is disposed between the first area and the second area, the plurality of line spacers further includes a plurality of third line spacers disposed in the third area, and heights of the plurality of third line spacers are greater than the heights of the plurality of first line spacers and the heights of the plurality of second line spacers.

In an exemplary embodiment, the rollable display unit further includes a plurality of protective layers and a display panel disposed between the plurality of protective layers. The display panel includes a plurality of pixels that displays an image, a plurality of data lines that transmits a data signal corresponding to the image, and a plurality of scan lines that transmits a scan signal that selects a pixel from among the plurality of pixels to which the data signal is to be applied. The plurality of line spacers and the plurality of scan lines extend in a same direction.

In an exemplary embodiment, the rollable display device further includes a data driver connected to the plurality of data lines. The data driver provides the data signal, and the data driver is disposed adjacent to the first side of the rollable display unit.

In an exemplary embodiment, the rollable display device further includes a scan driver connected to the plurality of scan lines. The scan driver provides the scan signal, the scan driver is disposed adjacent to a side of the rollable display unit other than the first side and the second side, and the scan driver extends in the rolling direction.

In an exemplary embodiment, the plurality of pixels includes organic light emitting diodes, and the plurality of line spacers does not overlap with light emission surfaces of the organic light emitting diodes.

In an exemplary embodiment, the plurality of pixels shares a pixel defining layer, the light emission surfaces of the organic light emitting diodes are exposed through a plurality of openings of the pixel defining layer, and the plurality of line spacers is disposed on an upper portion of the pixel defining layer.

According to an exemplary embodiment of the present disclosure, a rollable display device includes a roller defining a rolling direction, and a rollable display unit. A first side of the rollable display unit is fixed to the roller, the rollable display unit includes a plurality of spacers spaced apart from one another and arranged in the rolling direction, and a density of the spacers disposed near a second side of the rollable display unit opposing the first side is larger than a density of the spacers disposed near the first side of the rollable display unit.

In an exemplary embodiment, the density of the plurality of spacers gradually decreases as the plurality of spacers is disposed closer to the first side of the rollable display unit.

In an exemplary embodiment, the rollable display unit includes a plurality of areas defined according to a radius of the roller and a thickness of the rollable display unit, and the density of the plurality of spacers is different depending on the plurality of areas.

In an exemplary embodiment, the plurality of spacers is a plurality of line spacers, and each of the plurality of line spacers extends in a direction substantially perpendicular to the rolling direction.

According to an exemplary embodiment of the present disclosure, a rollable display device includes a roller defining a rolling direction, and a rollable display unit. A first side of the rollable display unit is fixed to the roller, the rollable display unit includes a plurality of spacers spaced apart from one another and arranged in the rolling direction, heights of the plurality of spacers gradually decrease as the plurality of spacers is disposed closer to the first side of the rollable display unit, and a density of the plurality of spacers gradually decreases as the plurality of spacers is disposed closer to the first side of the rollable display unit.

BRIEF DESCRIPTION OF THE DRAWINGS

The above and other features of the present disclosure will become more apparent by describing in detail exemplary embodiments thereof with reference to the accompanying drawings, in which.

DETAILED DESCRIPTION OF THE EXEMPLARY EMBODIMENTS

Figure 1:
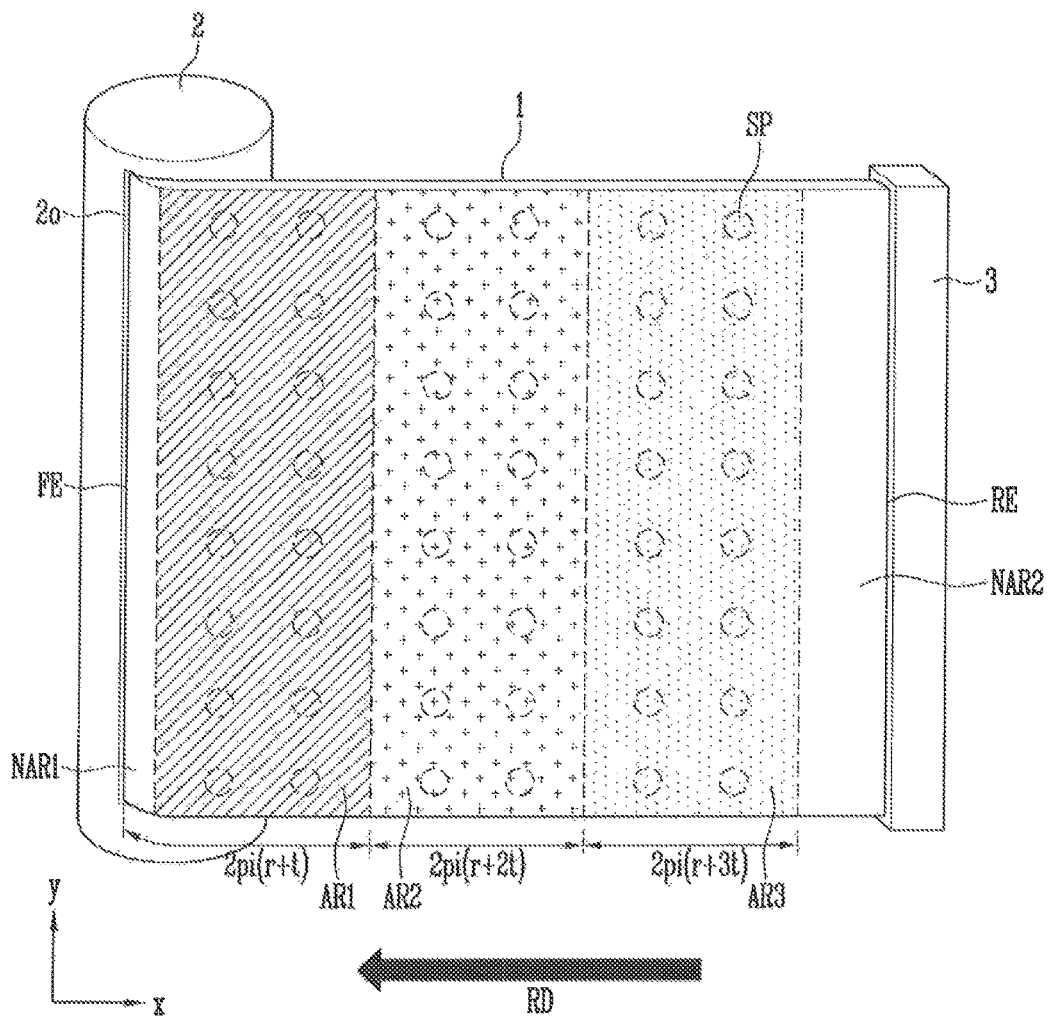
FIG. 1 is a diagram illustrating a rollable display device according to an exemplary embodiment of the present disclosure when the rollable display device is unrolled.

Exemplary embodiments of the present disclosure will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms.

Herein, when two or more elements or values are described as being substantially the same as or about equal to each other, it is to be understood that the elements or values are identical to each other, indistinguishable from each other, or distinguishable from each other but functionally the same as each other as would be understood by a person having ordinary skill in the art. It will be further understood that when two components or directions are described as extending substantially parallel or perpendicular to each other, the two components or directions extend exactly parallel or perpendicular to each other, or extend approximately parallel or perpendicular to each other within a measurement error as would be understood by a person having ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art.

Figure 2:
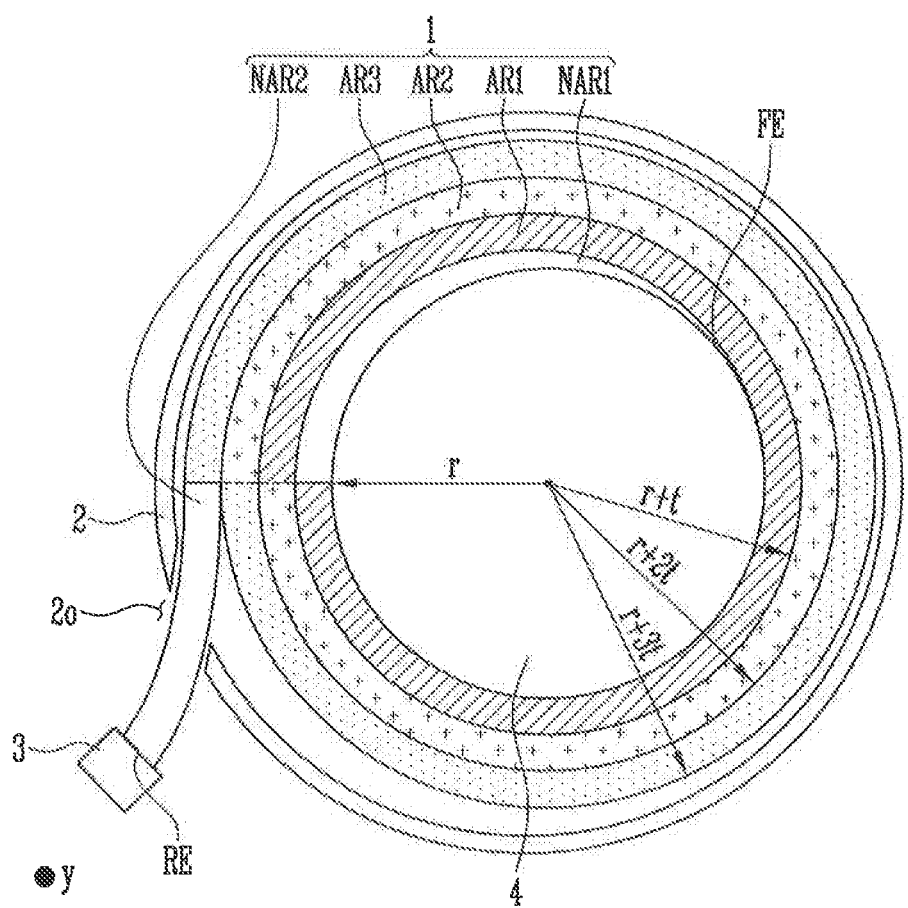
FIG. 2 is a diagram illustrating the rollable display device of an exemplary embodiment of the present disclosure when the rollable display device is rolled.

FIG. 1 is a diagram illustrating a rollable display device according to an exemplary embodiment of the present disclosure when the rollable display device is unrolled. FIG. 2 is a diagram illustrating the rollable display device according to an exemplary embodiment of the present disclosure when the rollable display device is rolled.

Referring to FIGS. 1 and 2, the rollable display device according to an exemplary embodiment of the present disclosure includes a rollable display unit 1, an outer housing 2, a stopper 3, and a roller 4.

The outer housing 2 includes an insertion opening 2o through which the rollable display unit 1 can be drawn in or out. For example, when transitioning from the rolled position to the unrolled position, the rollable display unit 1 is drawn out of the insertion opening 2o, and when transitioning from the unrolled position to the rolled position, the rollable display unit 1 is drawn into the insertion opening 2o. The size of the insertion opening 2o is large enough to accommodate the rollable display unit 1 as measured from a first side FE to a second, opposing side RE of the rollable display unit 1. The size of the insertion opening 2o is smaller than the size of the stopper 3, resulting in the stopper 3 being caught without being drawn into the insertion opening 2o.

In an exemplary embodiment, the roller 4 is a cylindrical member having a radius r. The roller 4 defines a rolling direction RD of the rollable display unit 1 according to its rotation direction. The roller 4 may be manually rotated by a human force, or automatically rotated by, for example, a driving motor.

In an exemplary embodiment, the rollable display unit 1 is a rectangular display unit. The first side FE of the rollable display unit 1 is fixed to the roller 4, and the second side RE of the rollable display unit 1 is fixed to the stopper 3. Therefore, as the roller 4 rotates, the rollable display unit 1 is rolled in the rolling direction RD to take the form as shown in FIG. 2.

According to exemplary embodiments of the present disclosure, the rollable display unit 1 includes a plurality of spacers SP arranged in the rolling direction RD. The heights of spacers SP provided near the second side RE are greater than the heights of spacers SP provided near the first side FE. That is, the heights of spacers SP disposed closer the second side RE are greater than the heights of spacers SP disposed closer to the first side FE. For example, the plurality of spacers SP may be lower in the vicinity of the first side FE of the rollable display unit 1 than the second side RE of the rollable display unit 1.

According to exemplary embodiments of the present disclosure, the heights of the plurality of spacers SP gradually decrease as the plurality of spacers SP are disposed closer to the first side FE of the rollable display unit 1. For example, the heights of the plurality of spacers SP gradually decrease in the rolling direction RD. An exemplary embodiment having this configuration will be described with reference to FIG. 9.

Referring to FIG. 2, when the rollable display device is rolled, an area adjacent to the second side RE of the rollable display unit 1 may be vulnerable to an external impact because the area adjacent to the second side RE may be disposed on an outer surface of the rollable display device compared to an area adjacent to the first side FE of the rollable display unit 1. According to exemplary embodiments of the present disclosure, the impact resistance may be selectively improved by making heights of the plurality of spacers SP, which are disposed adjacent to the second side RE of the rollable display unit 1, greater.

For example, if heights of the spacers SP provided on the first side FE of the rollable display unit 1 are equal to heights of the spacers SP provided on the second side RE, defects such as, for example, layer separation, buckling, etc., may occur due to increased rolling stiffness. According to exemplary embodiments of the present disclosure, protection against external impact may be provided while also reducing the rolling stiffness by making the heights of the plurality of spacers SP disposed adjacent to the first side FE smaller than the heights of the plurality of spacers SP disposed in other areas. Since the plurality of spacers SP disposed adjacent to the first side FE are disposed on an inner surface when the rollable display unit 1 is rolled, these spacers SP are relatively safe from external impact, and thus, the heights of these spacers SP may be reduced compared to the heights of other spacers SP.

In an exemplary embodiment, the rollable display unit 1 includes a plurality of areas AR1, AR2, and AR3, which are defined according to the radius r of the roller 4 and a thickness t of the rollable display unit 1, as described further below. For example, the areas AR1, AR2, and AR3 may be defined based on equations that are defined by the radius r of the roller 4 and the thickness t of the rollable display unit 1. Each of the plurality of areas AR1, AR2, and AR3 are display areas in which an image is displayed. The rollable display unit 1 may further include non-display areas NAR1 and NAR2 in which an image is not displayed.

Referring to FIG. 2, a first area AR1 may be rolled with about a radius r+t from a center of the roller 4, a second area AR2 may be rolled with about a radius r+2t from a center of the roller 4, and a third area AR3 may be rolled with about a radius r+3t from a center of the roller 4. Although the exemplary embodiment described with reference to FIGS. 1 and 2 illustrate a rollable display unit 1 having three display areas, exemplary embodiments of the present disclosure are not limited thereto. For example, in exemplary embodiments, the rollable display unit 1 may include two display areas, or four or more display areas.

Referring again to FIG. 1, in an exemplary embodiment, a length of each area in the rolling direction RD is defined by a formula for the circumference of a circle based on each radius. For example, the first area AR1 may have a length equal to about 2pi(r+t) in the rolling direction RD, the second area AR2 may have a length equal to about 2pi(r+2t) in the rolling direction RD, and the third area AR3 may have a length equal to about 2pi(r+3t) in the rolling direction RD.

In an exemplary embodiment, the heights of the plurality of spacers SP are different depending on the plurality of areas AR1, AR2, and AR3. For example, in an exemplary embodiment, the heights of a plurality of first spacers SP disposed in the first area AR1 closest to the roller 4 are less than the heights of a plurality of second spacers SP disposed in the second area AR2, and the heights of a plurality of third spacers SP disposed in the third area AR3 furthest away from the roller 4 are greater than the heights of the plurality of first spacers and the plurality of second spacers. An exemplary embodiment having this configuration will be described with reference to FIG. 8.

In an exemplary embodiment according to FIG. 1, when the rollable display unit 1 is rolled, the rollable display device has a cylindrical shape by making the thickness of each area AR1, AR2, and AR3 constant. As a result, the outer housing 2 may be conveniently designed and may have a cylindrical shape, and the impact resistance may be selectively improved while preventing an excessive increase in rolling stiffness, as described above.

Figure 3:
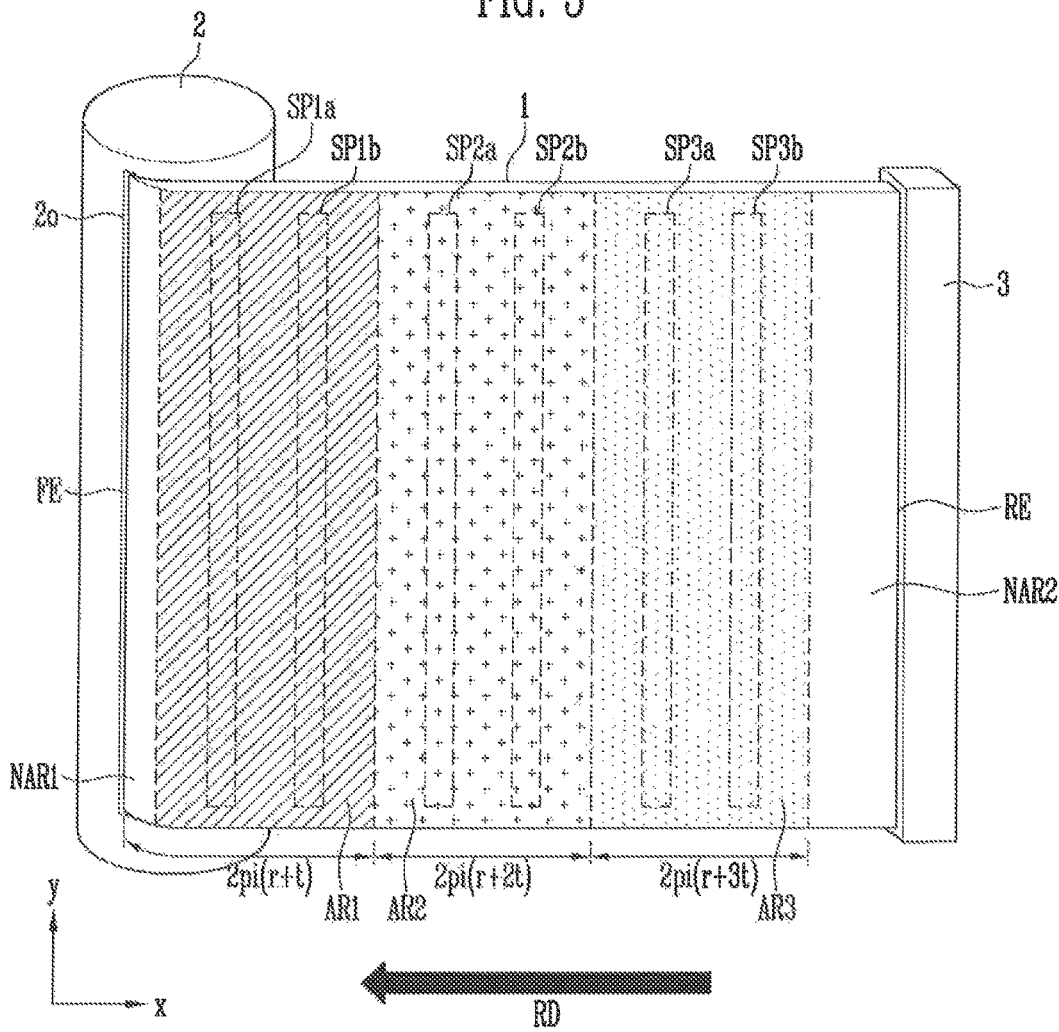
FIG. 3 is a diagram illustrating a rollable display device according to an exemplary embodiment of the present disclosure.

FIG. 3 is a diagram illustrating a rollable display device according to an exemplary embodiment of the present disclosure.

The exemplary embodiment of FIG. 3 has the same elements as the exemplary embodiment of FIG. 1, except for a plurality of line spacers SP1a, SP1b, SP2a, SP2b, SP3a, and SP3b. For convenience of explanation, a further description of elements previously described will be omitted.

Referring to FIG. 3, in an exemplary embodiment, the plurality of spacers is a plurality of line spacers SP1a to SP3b. Each of the plurality of line spacers SP1a to SP3b extends in a direction substantially perpendicular to the rolling direction RD. For example, as shown in FIG. 3, the rolling direction RD is in the horizontal (x) direction, and each of the plurality of line spacers SP1a to SP3b extends lengthwise in the vertical (y) direction. Referring to FIGS. 2 and 3, when the rolling direction RD is the (−x) direction, the direction substantially perpendicular to the rolling direction RD is the (y or −y) direction.

Still referring to FIG. 3, in an exemplary embodiment, the heights of the plurality of line spacers SP1a to SP3b gradually decreases as the plurality of line spacers SP1a to SP3b are disposed closer to the first side FE of the rollable display unit 1. For example, the heights of the plurality of line spacers SP1a to SP3b gradually decreases in the rolling direction RD. An exemplary embodiment having this configuration will be described later with reference to FIG. 9.

The plurality of line spacers SP1a to SP3b of FIG. 3 may have an increased surface area compared to the plurality of spacers SP of FIG. 1. As a result, the rollable display unit 1 may be more rigid to withstand an external impact. Furthermore, because the increased surface area is disposed in a direction substantially perpendicular to the rolling direction RD, the increased surface area may not affect the increase in rolling stiffness when the rollable display unit 1 is rolled as shown in FIG. 2. Therefore, the exemplary embodiment of FIG. 3 may cause a small increase in rolling stiffness while providing greater impact resistance compared to the exemplary embodiment of FIG. 1.

According to an exemplary embodiment of the present disclosure, the rollable display unit 1 includes the plurality of areas AR1, AR2, and AR3 defined according to the radius r of the roller 4 and the thickness t of the rollable display unit 1, in which the heights of the plurality of line spacers SP1a to SP3b are different depending on the plurality of areas AR1, AR2, and AR3. For example, in an exemplary embodiment, the heights of the plurality of first line spacers SP1a and SP1b disposed in the first area AR1 closest to the roller 4 are less than the heights of the plurality of second line spacers SP2a and SP2b disposed in the second area AR2, and the heights of the plurality of third line spacers SP3a and SP3b disposed in the third area AR3 furthest away from the roller 4 are larger than the heights of the plurality of first line spacers SP1a and SP1b and the plurality of second line spacers SP2a and SP2b. An exemplary embodiment having this configuration will be described with reference to FIG. 8.

In an exemplary embodiment according to FIG. 3, when the rollable display unit 1 is rolled, the rollable display device has a cylindrical shape by making the thickness of each area AR1, AR2, and AR3 constant. Thus, the outer housing 2 may conveniently designed and may have a cylindrical shape, and the impact resistance may be selectively improved while preventing an excessive increase in rolling stiffness.

Figure 4:
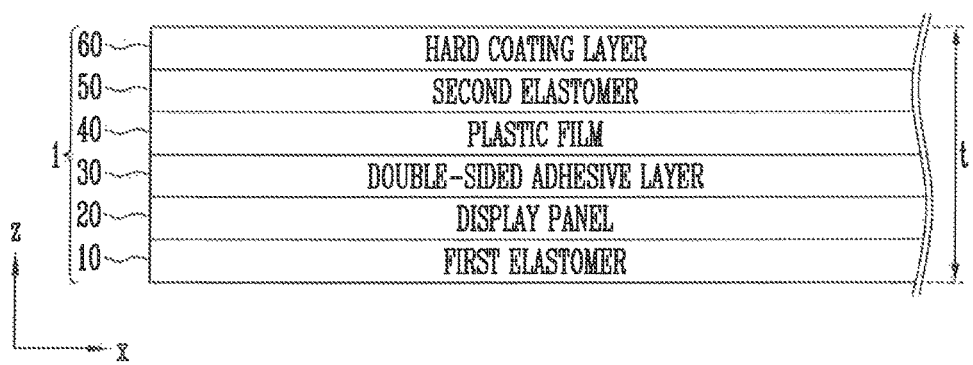
FIG. 4 is a diagram illustrating a stacked structure of a rollable display unit according to an exemplary embodiment of the present disclosure.

FIG. 4 is a diagram illustrating a stacked structure of the rollable display unit 1 according to an exemplary embodiment of the present disclosure.

Referring to FIG. 4, in an exemplary embodiment, the rollable display unit 1 includes a plurality of protective layers 10, 40, 50, and 60, and a display panel 20 disposed between the plurality of protective layers 10, 40, 50, and 60. A double-sided adhesive layer 30 may be interposed between the display panel 20 and a plastic film 40 for bonding.

The plurality of protective layers 10, 40, 50, and 60 may be, for example, a first elastomer 10, the plastic film 40, a second elastomer 50, and a hard coating layer 60.

The first elastomer 10 and the second elastomer 50 may be composed of a material having an elastic force that can be easily recovered even if it is rolled, and also having an impact resistance. For example, the first and second elastomers 10 and 50 may be composed of a material such as polyurethane.

The plastic film 40 may be a polarizing film or a transparent film depending on a required function of a product. The plastic film 40 may be composed of a flexible material such as, for example, polyimide. The plastic film 40 may include a more rigid material than the elastomers 10 and 50. The plastic film may be disposed above the display panel 20 in a direction of a displaying surface.

The hard coating layer 60 may be a layer for preventing scratching and may be disposed at the top of the rollable display unit 1. The hard coating layer 60 may be disposed above the display panel 20 in the direction of the displaying surface. The hard coating layer 60 may be composed of a material such as, for example, acrylic, urethane, silicon, etc.

The display panel 20 will be described below with reference to FIG. 5.

Figure 5:
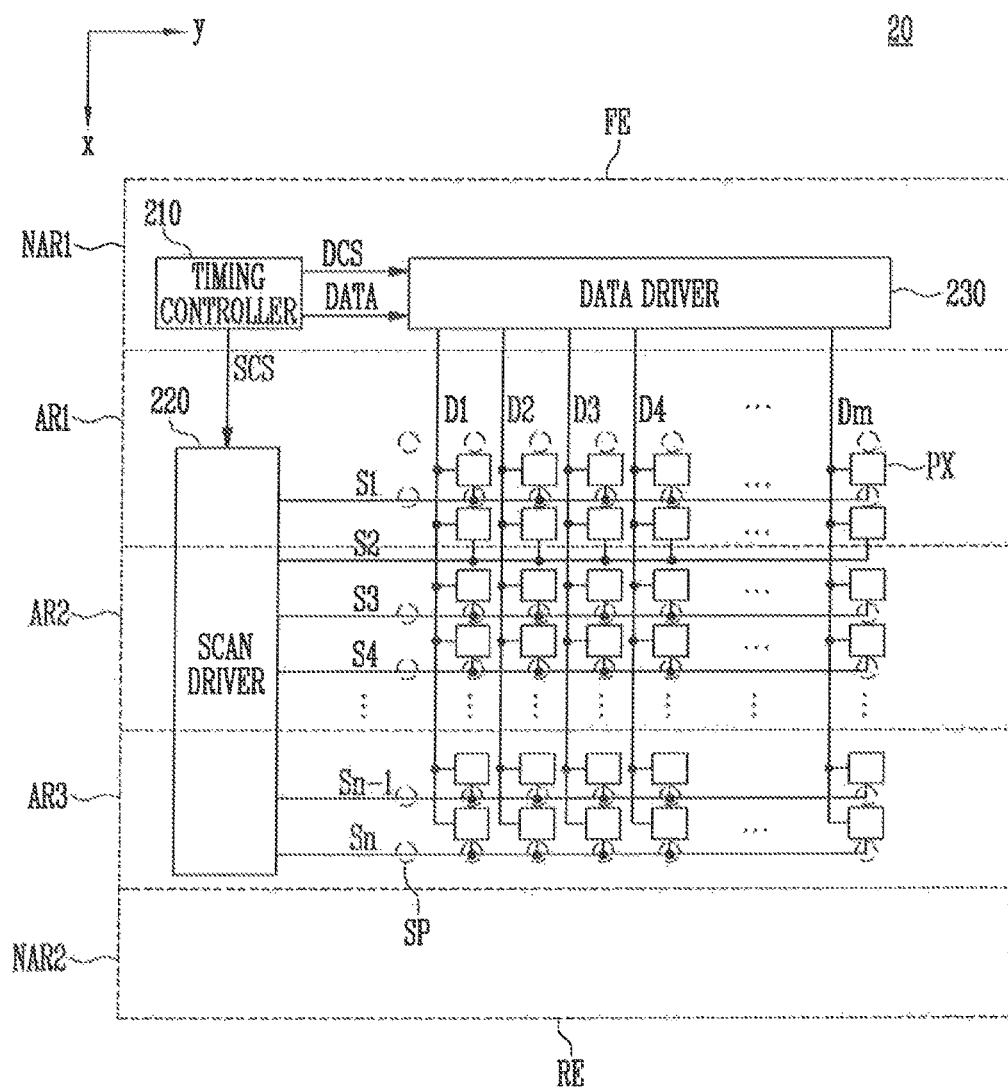
FIG. 5 is a diagram illustrating a display panel according to an exemplary embodiment of the present disclosure.

FIG. 5 is a diagram illustrating the display panel 20 according to an exemplary embodiment of the present disclosure. For example, FIG. 5 illustrates the display panel 20 according to the exemplary embodiment of FIG. 1.

Referring to FIG. 5, the display panel 20 according an exemplary embodiment of the present disclosure includes a timing controller 210, a scan driver 220, a data driver 230, and a plurality of pixels PX.

The timing controller 210 may receive an image signal and an image control signal from a host system such as, for example, an external application processor (AP). The timing controller 210 may convert the received image signal and the received image control signal according to specifications of the display panel 20, and may transmit a generated and corrected image signal DATA and a data control signal DCS to the data driver 230. Furthermore, the timing controller 210 may transmit a generated scan control signal SCS to the scan driver 220.

The data driver 230 may be connected to the plurality of pixels PX through a plurality of data lines D1, D2, D3, D4, . . . , and Dm. The data driver 230 may generate a data signal based on the data control signal DCS and the image signal DATA, and may apply the data signal to the plurality of data lines D1 to Dm corresponding thereto. For example, the data driver 230 may apply a plurality of data signals in a unit of pixel rows simultaneously to the plurality of data lines D1 to Dm.

The scan driver 220 may be connected to the plurality of pixels PX through a plurality of scan lines S1, S2, S3, S4, . . . , Sn−1, and Sn. The scan driver 220 may generate a scan signal based on the scan control signal SCS and apply the scan signal to the plurality of scan lines S1 to Sn corresponding thereto. For example, the scan driver 220 may include a plurality of stage circuits connected in the form of a shift register, and each of the stage circuits may sequentially apply the scan signal to the corresponding scan line based on an output of a previous stage circuit. Therefore, pixels connected to an identical scan line may be selected simultaneously according to the scan signal, and the selected pixels may have the corresponding data signal as an input.

Each of the plurality of pixels PX may display an image based on the data signal written thereto. Each pixel may emit light at a gray level corresponding to the data signal. An exemplary structure of each pixel PX will be described with reference to FIG. 7.

The timing controller 210 and the data driver 230 may be formed of a single driver integrated circuit (IC). The driver IC including the timing controller 210 and the data driver 230 may be disposed in the non-display area NAR1. For example, the data driver 230 may be disposed adjacent to the first side FE of the rollable display unit 1. Referring to FIGS. 1 and 2, since the non-display area NAR1 is the closest area to the roller 4, rolling stress may not be applied thereto. The non-display area NAR1 may not be rolled because the non-display area NAR1 is fixedly attached to the roller 4.

Although the driver IC including the timing controller 210 and the data driver 230 is illustrated as being mounted on the display panel 20 in the exemplary embodiment of FIG. 5, exemplary embodiments of the present disclosure are not limited thereto. For example, in exemplary embodiments, a pad unit is disposed at the current location of the driver IC, and the driver IC may be disposed on a flexible printed circuit board (FPCB) connected to the pad unit. In this exemplary embodiment, the bonding between the pad unit and the FPCB should be maintained, and since the pad unit is disposed in the non-display area NAR1, the bonding may be firmly maintained regardless of rolling.

In an exemplary embodiment, the scan driver 220 is disposed adjacent to another side of the rollable display unit 1 which is not the first side FE or the second side RE of the rollable display unit 1, and the scan driver 220 extends in the rolling direction RD. For example, although the scan driver 220 is illustrated as being disposed on a left side of the plurality of pixels PX in FIG. 5, the scan driver 220 may be disposed on a right side of the plurality of pixels PX according to exemplary embodiments. The rolling direction RD may be the (-x) direction referring to FIG. 1, and the scan driver 220 may extend in the (-x or x) direction referring to FIG. 5.

In an exemplary embodiment, the scan driver 220 includes the plurality of stage circuits as described above, and each stage circuit may have a substantially identical circuit structure. Since the repeated circuit structure pattern is arranged in the (-x or x) direction, uniform stress may be applied to each stage by rolling in the rolling direction RD. Therefore, according to this embodiment, the scan driver 220 may be conveniently designed. In an exemplary embodiment, the scan driver 220 may be configured as a part of the driver IC, and may be disposed in the non-display area NAR1.

In an exemplary embodiment, the arrangement direction of the plurality of spacers SP corresponds to the extending direction of the plurality of scan lines S1 to Sn.

As described above, the data driver 230 may be disposed in the non-display area NAR1 adjacent to the first side FE, and the scan driver 220 may extend along the plurality of areas AR1, AR2, and AR3. Therefore, in an exemplary embodiment, the arrangement direction of the plurality of spacers SP may correspond to the extending direction of the plurality of scan lines S1 to S2n.

Figure 6:
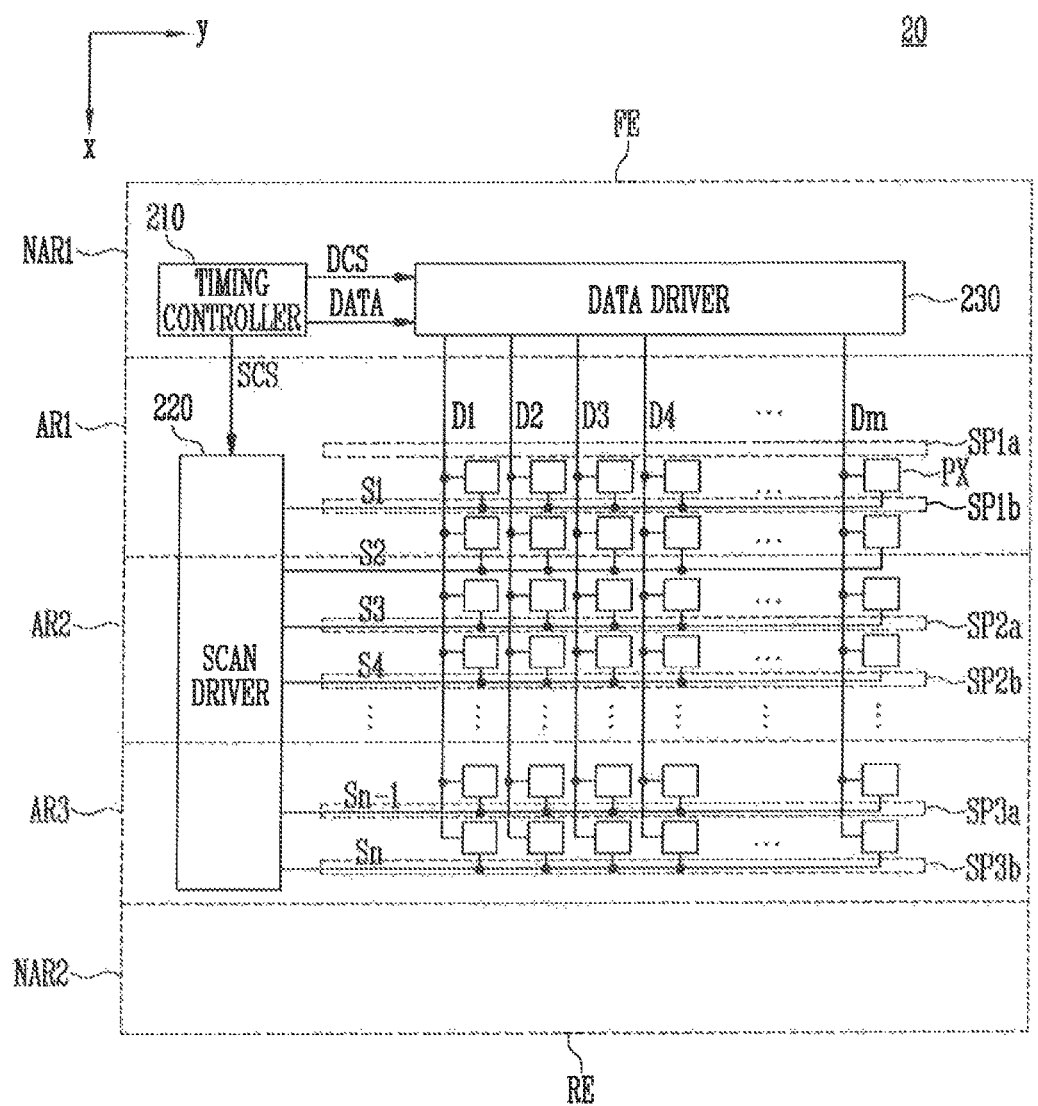
FIG. 6 is a diagram illustrating a display panel according to an exemplary embodiment of the present disclosure.

FIG. 6 is a diagram illustrating a display panel according to an exemplary embodiment of the present disclosure. For example, FIG. 6 illustrates the display panel 20 according to the exemplary embodiment of FIG. 3.

The exemplary embodiment of FIG. 6 differs from the exemplary embodiment of FIG. 5 in that the plurality of spacers SP are replaced by the plurality of line spacers SP1a to SP3b. For convenience of explanation, since the other elements are identical, a further description of such elements will be omitted.

Referring to FIG. 6, in an exemplary embodiment, an extending direction of the plurality of line spacers SP1a to SP3b corresponds to the extending direction of the plurality of scan lines S1 to Sn.

As described above, in an exemplary embodiment, the data driver 230 may be disposed in the non-display area NAR1 adjacent to the first side FE, and the scan driver 220 may be disposed extending along the plurality of areas AR1, AR2, and AR3. Therefore, in an exemplary embodiment, the extending direction of the plurality of line spacers SP1a to SP3b corresponds to the extending direction of the plurality of scan lines S1 to Sn.

Figure 7:
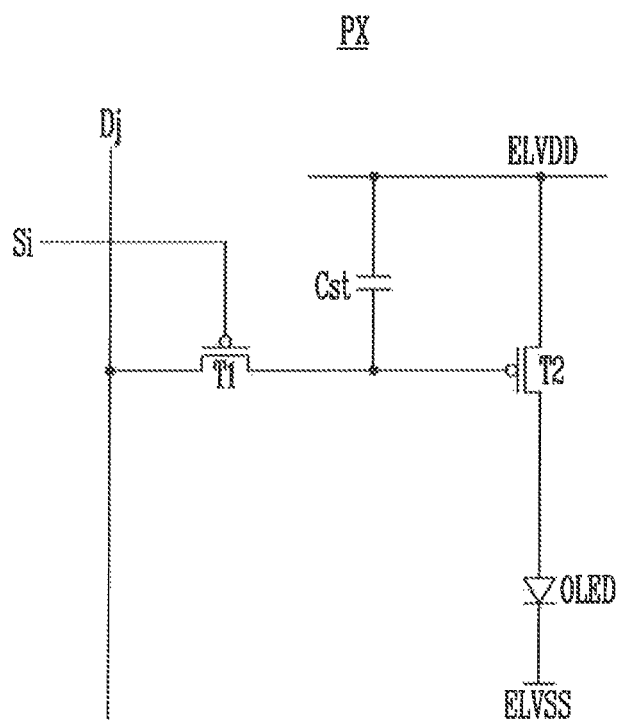
FIG. 7 is a circuit diagram illustrating a pixel according to an exemplary embodiment of the present disclosure.

FIG. 7 is a circuit diagram illustrating a pixel according to an exemplary embodiment of the present disclosure.

In an exemplary embodiment, the pixel PX includes a plurality of transistors T1 and T2, a storage capacitor Cst, and an organic light emitting diode OLED.

In an exemplary embodiment, the plurality of transistors T1 and T2 includes P-type transistors. However, exemplary embodiments of the present disclosure are not limited thereto. For example, in exemplary embodiments, the plurality of transistors T1 and T2 may be formed of N-type transistors, and a substantially identical function may be achieved by modifying some part of electrical connections therebetween.

In an exemplary embodiment, one electrode of the transistor T1 is connected to a data line Dj, the other electrode of the transistor T1 is connected to a gate electrode of the transistor T2, and a gate electrode of the transistor T1 is connected to a scan line Si. The transistor T1 may be referred to as a scan transistor.

In an exemplary embodiment, one electrode of the storage capacitor Cst is connected to a voltage source ELVDD, and another electrode of the storage capacitor Cst is connected to the gate electrode of the transistor T2.

In an exemplary embodiment, an anode of the organic light emitting diode OLED is connected to the other electrode of the transistor T2, and a cathode of the organic light emitting diode OLED is connected to a voltage source ELVSS. In an exemplary embodiment, the anode of the organic light emitting diode OLED is connected to the voltage source ELVDD, and the cathode of the organic light emitting diode OLED is connected to the one electrode of the transistor T2.

Hereinafter, a driving method of the pixel PX will be described.

When the scan driver 220 applies a scan signal of a turn-on level to the scan line Si, the transistor T1 is turned on. Accordingly, a data signal may be transferred from the data line Dj to the other electrode of the storage capacitor Cst, and the storage capacitor Cst may write and hold a difference between the voltage source ELVDD and the data signal. The degree of conduction of the transistor T2 may be determined depending on the voltage written to the storage capacitor Cst so that the amount of a driving current flowing from the voltage source ELVDD to the voltage source ELVSS may be determined. The organic light emitting diode OLED may emit light at a corresponding gray level depending on the amount of the driving current.

In an exemplary embodiment, another pixel including emission control transistors disposed on the driving current path between the voltage sources ELVDD and ELVSS may be used. In this exemplary embodiment, a light emission control driver may be utilized. The light emission control driver may be composed of a plurality of stage circuits, so that the arrangement thereof may be similar to the arrangement of the scan driver 220 as described above.

Figure 8:
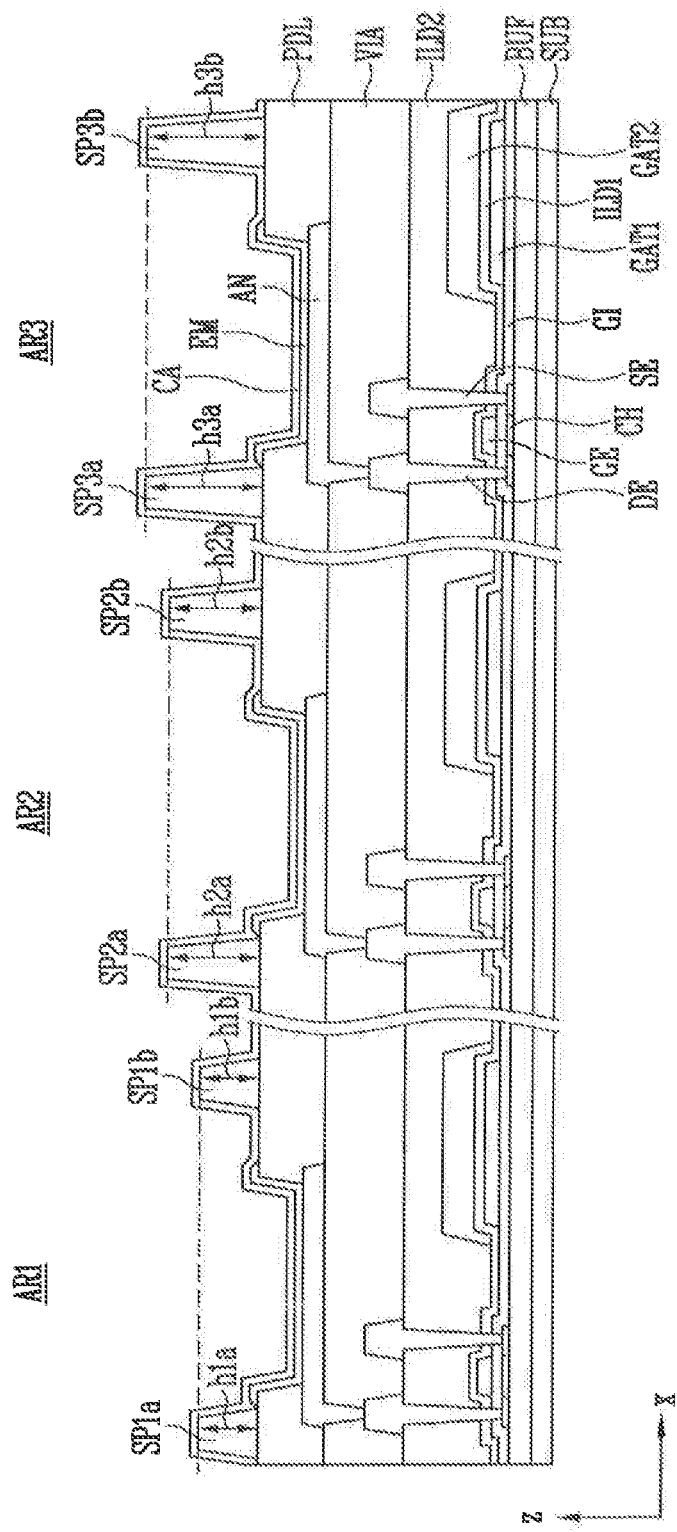
FIG. 8 is a diagram illustrating a structure of pixels for each of a plurality of areas according to an exemplary embodiment of the present disclosure.

FIG. 8 is a diagram illustrating a structure of pixels in each of a plurality of display areas according to an exemplary embodiment of the present disclosure.

Referring to FIG. 8, an exemplary pixel stacking structure is shown in each of the areas AR1, AR2, and AR3. Each pixel may have the same circuit configuration as the configuration described above with reference to FIG. 7. The structure of the pixels will be described on the basis of a pixel disposed in the third display area AR3.

In an exemplary embodiment, a buffer layer BUF, which functions as a selective protective layer, is formed and disposed on a substrate SUB. The buffer layer BUF may be composed of, for example, an organic material. The substrate SUB may be composed of, for example, polyimide.

In an exemplary embodiment, a channel CH composed of a semiconductor material (e.g., silicon, oxide semiconductor, etc.) is formed and disposed on the buffer layer BUF.

When the channel CH includes silicon, both ends of the channel CH may be doped to include areas to be in contact with one electrode (e.g., a source electrode SE) and the other electrode (e.g., a drain electrode DE). The channel CH may be covered by a gate insulating layer GI.

In an exemplary embodiment, a gate electrode GE is formed and disposed on the gate insulating layer GI at a position corresponding to the channel CH. A lower electrode GAT1 of the storage capacitor Cst may be formed together with the gate electrode GE. The gate electrode GE and the lower electrode GAT1 of the storage capacitor Cst may be covered by a first insulating layer ILD1 composed of, for example, an inorganic material.

In an exemplary embodiment, an upper electrode GAT2 of the storage capacitor Cst is formed on the first insulating layer ILD1. The upper electrode GAT2 may be covered by a second insulating layer ILD2 composed of, for example, an inorganic material.

In an exemplary embodiment, the source electrode SE and the drain electrode DE of the transistor T2 may be formed after etching the second insulating layer ILD2, the first insulating layer ILD1, and the gate insulating layer GI. The source electrode SE and the drain electrode DE may be formed to correspond to the doping positions of the channel CH described above.

In an exemplary embodiment, a via layer VIA is formed on the source electrode SE, the drain electrode DE, and the second insulating layer ILD2. The via layer VIA may be etched to have an opening corresponding to the drain electrode DE. The opening may be formed to allow an anode AN of the organic light emitting diode OLED to be connected to the drain electrode DE therethrough. The via layer VIA may be composed of, for example, polyimide, other organic materials, etc.

In an exemplary embodiment, on the via layer VIA, a pixel defining layer PDL is formed and disposed so as to have an opening for defining (exposing) a light emission surface of the organic light emitting diode OLED. The pixel defining layer PDL may be shared by the plurality of pixels PX. The pixel defining layer PDL may be composed of, for example, polyimide, other organic materials, etc.

In an exemplary embodiment, the plurality of line spacers SP1a to SP3b is formed and disposed on the pixel defining layer PDL. The plurality of line spacers SP1a to SP3b may be composed of, for example, polyimide, another organic material, etc. In an exemplary embodiment, heights h1a and h1b of the first line spacers SP1a and SP1b disposed in the first area AR1 are substantially equal to each other, heights h2a and h2b of the second line spacers SP2a and SP2b disposed in the second area AR2 are substantially equal to each other, and heights h3a and h3b of the third line spacers SP3a and SP3b disposed in the third area AR3 are substantially equal to each other. The heights h2a and h2b of the second line spacers SP2a and SP2b are larger than the heights h1a and h1b of the first line spacers SP1a and SP1b, and the heights h3a and h3b of the third line spacers SP3a and SP3b are larger than the heights h2a and h2b of the second line spacers SP2a and SP2b.

In an exemplary embodiment according to FIG. 8, when the rollable display unit 1 is rolled, the rollable display device has a cylindrical shape by making the thickness of each of the areas AR1, AR2, and AR3 constant. As a result, the outer housing 2 may be conveniently designed and may have a cylindrical shape, and the impact resistance may be selectively improved while preventing an excessive increase in rolling stiffness, as described above.

Referring still to FIG. 8, in an exemplary embodiment, a light emitting layer EM of each pixel is formed and disposed in each opening of the pixel defining layer PDL. A cathode CA of the organic light emitting diode OLED may be formed and disposed on the light emitting layer EM, the pixel defining layer PDL, and the plurality of line spacers SP1a to SP3b.

Although the exemplary embodiment of FIG. 8 shows a plurality of line spacers SP1a to SP3b, it is to be understood that the exemplary embodiment of FIG. 8 may also be applied to the plurality of spacers SP of FIG. 1.

Figure 9:
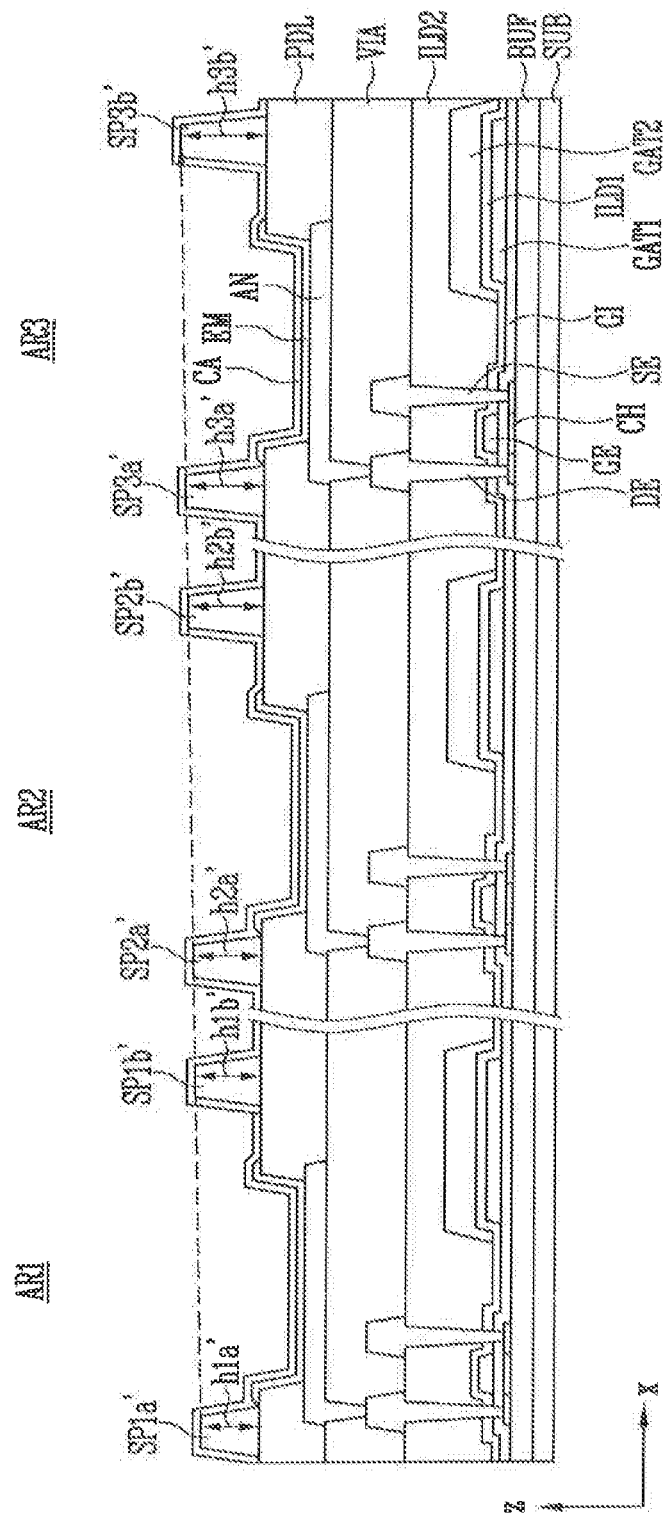
FIG. 9 is a diagram illustrating a structure of pixels for each of a plurality of areas according to an exemplary embodiment of the present disclosure.

FIG. 9 is a diagram illustrating a structure of pixels in each of a plurality of display areas according to an exemplary embodiment of the present disclosure.

The elements of FIG. 9 except heights h1a', h1b', h2a', h2b', h3a' and h3b' of a plurality of line spacers SP1a', SP1b', SP2a', SP2b', SP3a', and SP3b' may be substantially identical to those of FIG. 8. Thus, for convenience of explanation, a further description thereof will be omitted.

Referring to FIG. 9, in an exemplary embodiment, the heights h1a' to h3b' of the plurality of line spacers SP1a' to SP3b' gradually decreases in the rolling direction RD. Referring to FIGS. 1 to 3, the rolling direction RD may be the (−x) direction.

As described above with reference to FIGS. 1 to 3, the impact resistance may be selectively improved while preventing an excessive increase in rolling stiffness.

Although FIG. 9 shows a plurality of line spacers SP1a' to SP3b', it is to be understood that the exemplary embodiment of FIG. 9 may also be applied to the plurality of spacers SP of FIG. 1.

Figure 10:
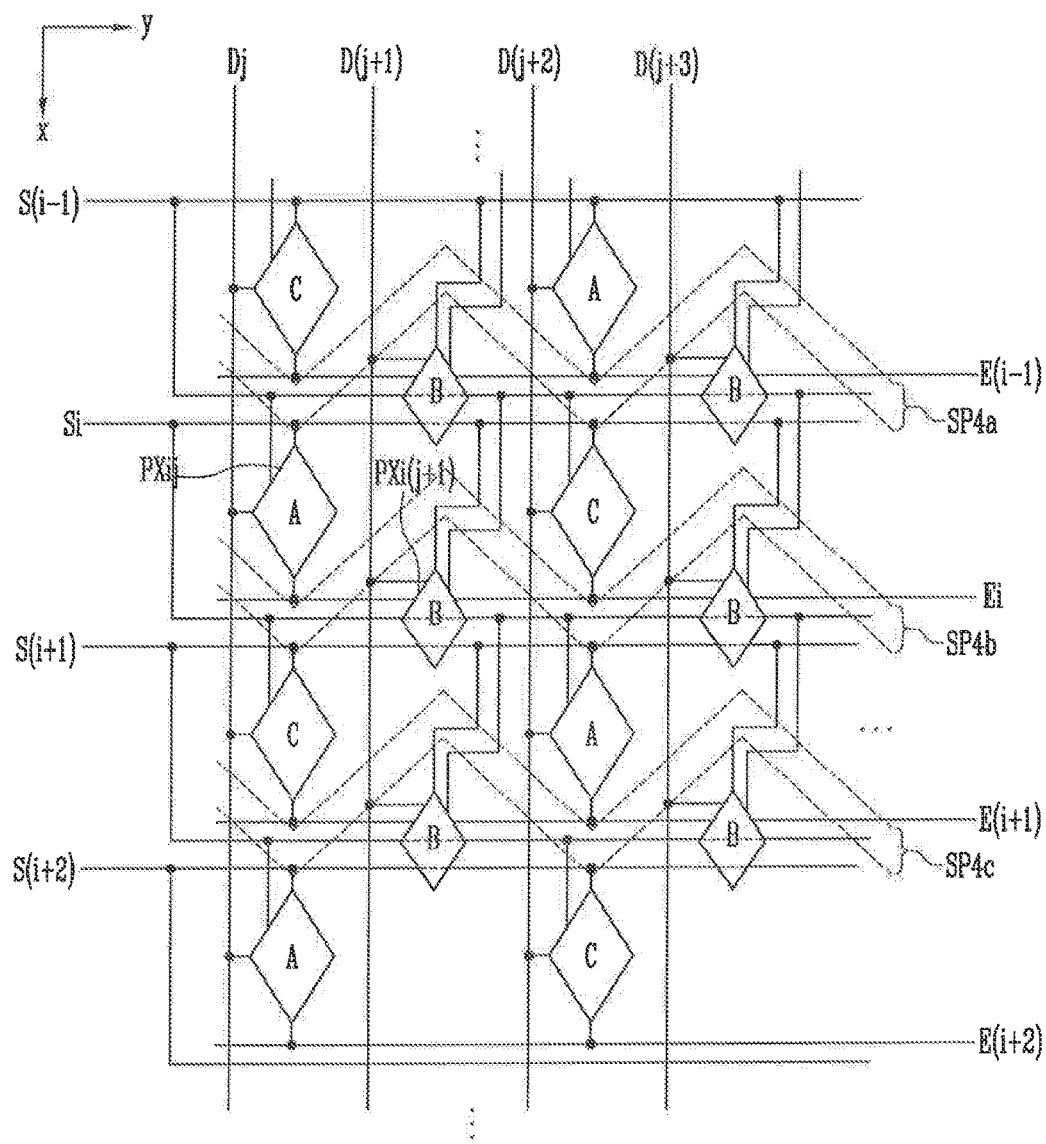
FIG. 10 is a diagram illustrating an exemplary structure of line spacers according to a diamond pixel structure according to an exemplary embodiment of the present disclosure.

FIG. 10 is a diagram illustrating an exemplary structure of line spacers according to a diamond pixel structure according to an exemplary embodiment of the present disclosure.

Referring to FIG. 10, in an exemplary embodiment, a plurality of pixels including PXij and PXi(j+1) having diamond-shaped emission surfaces of different sizes are shown. The pixel PXij corresponds to the pixel A or C, and the pixel PXi(j+1) corresponds to the pixel B. The pixel B may be, for example, a green pixel having a high light emitting efficiency compared to consumed energy, and the pixels A and C may be, for example, red and blue pixels having a low light emitting efficiency compared to consumed energy. The pixels are connected to a plurality of scan lines S(i−1), Si, S(i+1), and S(i+2), a plurality of data lines Dj, D(j+1), D(j+2), and D(j+3), and a plurality of emission control lines E(i−1), Ei, E(i+1), and E(i+2).

Referring to FIG. 10, it can be seen that in an exemplary embodiment, a plurality of line spacers SP4a, SP4b, and SP4c may be used even when the plurality of pixels have diamond-shaped emission surfaces.

For example, in an exemplary embodiment, the plurality of line spacers SP4a, SP4b, and SP4c is extended in a zigzag shape substantially corresponding to the direction of the scan lines S(i−1), Si, S(i+1), and S(i+2) so that the light emission surfaces of the respective pixels are not covered.

Figure 11:
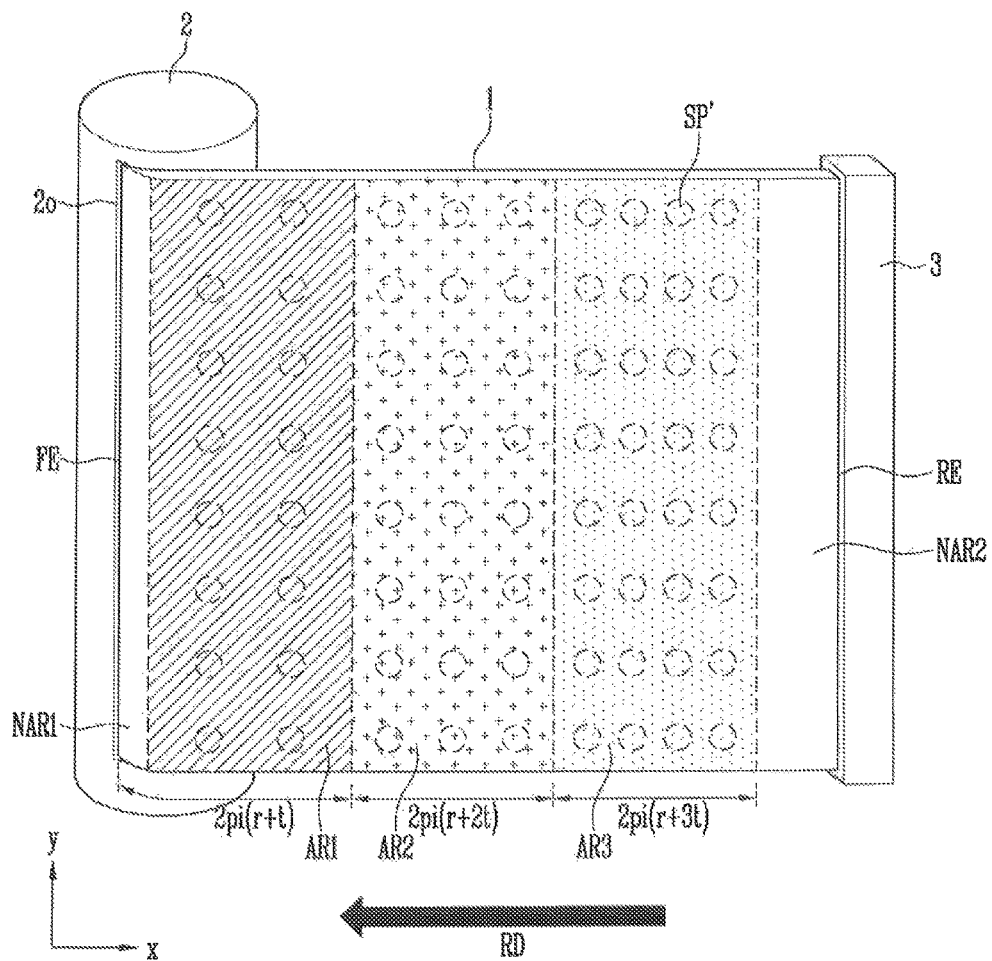
FIG. 11 is a diagram illustrating a rollable display device according to an exemplary embodiment of the present disclosure.

FIG. 11 is a diagram illustrating a rollable display device according to an exemplary embodiment of the present disclosure.

Compared to the exemplary embodiment of FIG. 1, since elements except a plurality of spacers SP' of the exemplary embodiment of FIG. 11 are substantially identical to those in FIG. 1, for convenience of explanation, a further description thereof will be omitted.

Unlike the exemplary embodiment of FIG. 1, in which the heights of the plurality of spacers SP are different depending on the plurality of areas AR1, AR2, and AR3, in the exemplary embodiment of FIG. 11, the heights of the plurality of spacers SP' are substantially the same throughout all of the areas AR1, AR2, and AR3.

However, in an exemplary embodiment according to FIG. 11, the plurality of spacers SP' has different densities depending on the plurality of areas AR1, AR2, and AR3.

For example, in an exemplary embodiment, a density of spacers provided near (e.g., closer to) the second side RE of the rollable display unit 1 is larger than a density of spacers provided near (e.g., closer to) the first side FE of the rollable display unit 1. For example, in an exemplary embodiment, the density of the plurality of spacers SP' gradually decreases as the plurality of spacers SP' are disposed closer to the first side FE.

The density of the spacers refers to the density of placement of the spacers. For example, the density of the spacers refers to how closely disposed the spacers are to one another. When spacers are disposed more closely to one another in a given area, more spacers are able to be disposed in the given area.

For example, in an exemplary embodiment, the density of the spacers SP' in the first area AR1 is lower than the density of the spacers SP' in the second area AR2, and the density of the spacers SP' in the third area AR3 is larger than the density of the spacers SP' in the second area AR2. As a result, as can be seen in FIG. 11, more spacers SP' are disposed in the third area AR3 than in the second area AR2, and more spacers SP' are disposed in the second area AR2 than in the first area AR1.

The exemplary embodiment of FIG. 11 may have substantially the same effect as the exemplary embodiment of FIG. 1. Furthermore, in an exemplary embodiment, in addition to the spacers being disposed in different densities, the heights of the plurality of spacers may also be different. For example, in an exemplary embodiment, the heights and density of spacers in the first area AR1 may be lower than the heights and density of spacers in the second area AR2, and the heights and density of spacers in the third area AR3 may be larger than the heights and density of spacers in the second area AR2.

Figure 12:
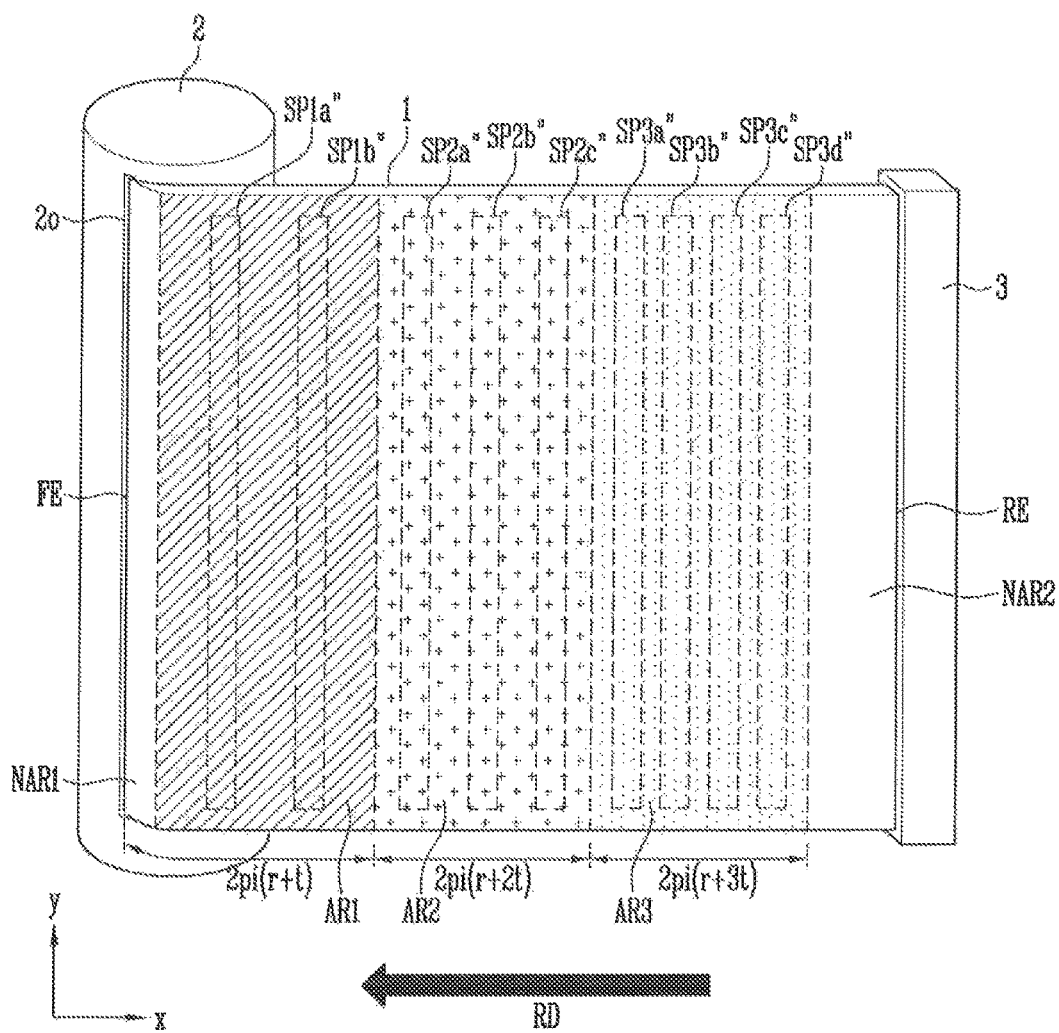
FIG. 12 is a diagram illustrating a rollable display device according to an exemplary embodiment of the present disclosure.

FIG. 12 is a diagram illustrating a rollable display device according to an exemplary embodiment of the present disclosure.

Compared to the exemplary embodiment of FIG. 3, since elements except a plurality of line spacers SP1a" to SP3d" of the exemplary embodiment of FIG. 12 are substantially identical to those in the exemplary embodiment of FIG. 3, for convenience of explanation, a further description thereof will be omitted.

Unlike the exemplary embodiment of FIG. 3, in which the heights of the plurality of line spacers SP1a to SP3b are different depending on the plurality of areas AR1, AR2, and AR3, the heights of the plurality of line spacers SP1a" to SP3d" in the exemplary embodiment of FIG. 12 may be substantially the same throughout all of the plurality of areas AR1, AR2, and AR3.

However, in the exemplary embodiment of FIG. 12, the plurality of line spacers SP1a" to SP3d" have different densities depending on the plurality of areas AR1, AR2, and AR3.

For example, in an exemplary embodiment, the density of line spacers provided near (e.g., closer to) the second side RE of the rollable display unit 1 is larger than the density of line spacers provided near (e.g., closer to) the first side FE of the rollable display unit 1. For example, in an exemplary embodiment, the density of the plurality of line spacers gradually decreases as the plurality of line spacers are disposed closer to the first side FE.

For example, in an exemplary embodiment, the density of line spacers SP1a" and SP1b" in the first area AR1 is lower than the density of line spacers SP2a", SP2b", and SP2c" in the second area AR2, and the density of line spacers SP3a", SP3b", SP3c", and SP3d" in the third area AR3 is larger than the density of line spacers SP2a", SP2b", and SP2c" in the second area AR2. As a result, as can be seen in FIG. 12, more line spacers are disposed in the third area AR3 than in the second area AR2, and more line spacers are disposed in the second area AR2 than in the first area AR1.

The exemplary embodiment of FIG. 12 may have substantially the same effect as the exemplary embodiment of FIG. 3. Furthermore, in an exemplary embodiment, in addition to the different densities, heights of the plurality of line spacers SP1a" to SP3d" may also be different. For example, in an exemplary embodiment, the heights and density of the line spacers SP1a" and SP1b" in the first area AR1 are less than the heights and density of the line spacers SP2a", SP2b", and SP2c" in the second area AR2, and the heights and density of the line spacers SP3a", SP3b", SP3c", and SP3d" in the third area AR3 are larger than the heights and density of the line spacers SP2a", SP2b", and SP2c" in the second area AR2.

According to exemplary embodiments of the present disclosure, a rollable display device includes spacers which are different in height corresponding to a rolling direction. As a result, a rollable display device is provided in which impact resistance is selectively enhanced while an excessive increase in rolling stiffness is also prevented.

While the present disclosure has been particularly shown and described with reference to the exemplary embodiments thereof, it will be understood by those of ordinary skill in the art that various changes in form and detail may be made therein without departing from the spirit and scope of the present disclosure as defined by the following claims.

What is claimed is:

1. A rollable display device, comprising:
   a roller defining a rolling direction; and
   a rollable display unit, wherein a first side of the rollable display unit is fixed to the roller,
   wherein the rollable display unit comprises a plurality of spacers spaced apart from one another and arranged in the rolling direction,
   wherein heights of the spacers disposed near a second side of the rollable display unit opposing the first side are greater than heights of the spacers disposed near the first side of the rollable display unit.

2. The rollable display device of claim 1, wherein the heights of the plurality of spacers gradually decrease as the plurality of spacers is disposed closer to the first side of the rollable display unit.

3. The rollable display device of claim 1, wherein the rollable display unit comprises:
   a plurality of areas defined according to a radius of the roller and a thickness of the rollable display unit,
   wherein the heights of the plurality of spacers are different depending on the plurality of areas.

4. The rollable display device of claim 3, wherein the plurality of areas comprises:
   a first area disposed adjacent to the roller; and
   a second area disposed adjacent to the first area,
   wherein the plurality of spacers comprises a plurality of first spacers disposed in the first area and a plurality of second spacers disposed in the second area,
   wherein heights of the plurality of first spacers are less than heights of the plurality of second spacers.

5. The rollable display device of claim 4,
   wherein the plurality of areas further comprises a third area disposed adjacent to the second area, wherein the second area is disposed between the first area and the third area, wherein the plurality of spacers further comprises a plurality of third spacers disposed in the third area, wherein heights of the plurality of third spacers are greater than the heights of the plurality of first spacers and the heights of the plurality of second spacers.

6. The rollable display device of claim 1, wherein the plurality of spacers is a plurality of line spacers, and each of the plurality of line spacers extends in a direction substantially perpendicular to the rolling direction.

7. The rollable display device of claim 6, wherein heights of the plurality of line spacers gradually decrease as the plurality of line spacers is disposed closer to the first side of the rollable display unit.

8. The rollable display device of claim 6, wherein the rollable display unit comprises:

a plurality of areas defined according to a radius of the roller and a thickness of the rollable display unit, wherein heights of the plurality of line spacers are different depending on the plurality of areas.

9. The rollable display device of claim 8, wherein the plurality of areas comprises:

a first area disposed adjacent to the roller; and a second area disposed adjacent to the first area, wherein the plurality of line spacers comprises a plurality of first line spacers disposed in the first area and a plurality of second line spacers disposed in the second area, wherein heights of the plurality of first line spacers are less than heights of the plurality of second line spacers.

10. The rollable display device of claim 9, wherein the plurality of areas further comprises a third area disposed adjacent to the second area, wherein the second area is disposed between the first area and the second area, wherein the plurality of line spacers further comprises a plurality of third line spacers disposed in the third area, wherein heights of the plurality of third line spacers are greater than the heights of the plurality of first line spacers and the heights of the plurality of second line spacers.

11. The rollable display device of claim 6, wherein the rollable display unit further comprises a plurality of protective layers and a display panel disposed between the plurality of protective layers, wherein the display panel comprises:

a plurality of pixels that displays an image;

a plurality of data lines that transmits a data signal corresponding to the image; and a plurality of scan lines that transmits a scan signal that selects a pixel from among the plurality of pixels to which the data signal is to be applied, wherein the plurality of line spacers and the plurality of scan lines extend in a same direction.

12. The rollable display device of claim 11, further comprising:

a data driver connected to the plurality of data lines, wherein the data driver provides the data signal, and the data driver is disposed adjacent to the first side of the rollable display unit.

13. The rollable display device of claim 11, further comprising:

a scan driver connected to the plurality of scan lines, wherein the scan driver provides the scan signal, the scan driver is disposed adjacent to a side of the rollable display unit other than the first side and the second side, and the scan driver extends in the rolling direction.

14. The rollable display device of claim 11, wherein the plurality of pixels comprises organic light emitting diodes, and the plurality of line spacers does not overlap with light emission surfaces of the organic light emitting diodes.

15. The rollable display device of claim 14, wherein the plurality of pixels shares a pixel defining layer, wherein the light emission surfaces of the organic light emitting diodes are exposed through a plurality of openings of the pixel defining layer, wherein the plurality of line spacers is disposed on an upper portion of the pixel defining layer.

16. A rollable display device, comprising:

a roller defining a rolling direction; and a rollable display unit, wherein a first side of the rollable display unit is fixed to the roller, wherein the rollable display unit comprises a plurality of spacers spaced apart from one another and arranged in the rolling direction, wherein a density of the spacers disposed near a second side of the rollable display unit opposing the first side is larger than a density of the spacers disposed near the first side of the rollable display unit.

17. The rollable display device of claim 16, wherein the density of the plurality of spacers gradually decreases as the plurality of spacers is disposed closer to the first side of the rollable display unit.

18. The rollable display device of claim 16, wherein the rollable display unit comprises a plurality of areas defined according to a radius of the roller and a thickness of the rollable display unit, and the density of the plurality of spacers is different depending on the plurality of areas.

19. The rollable display device of claim 16, wherein the plurality of spacers is a plurality of line spacers, and each of the plurality of line spacers extends in a direction substantially perpendicular to the rolling direction.

20. A rollable display device, comprising:

a roller defining a rolling direction; and a rollable display unit, wherein a first side of the rollable display unit is fixed to the roller, wherein the rollable display unit comprises a plurality of spacers spaced apart from one another and arranged in the rolling direction, wherein heights of the plurality of spacers gradually decrease as the plurality of spacers is disposed closer to the first side of the rollable display unit, and a density of the plurality of spacers gradually decreases as the plurality of spacers is disposed closer to the first side of the rollable display unit.

* * * * *